United States Patent [19]

Riebeek

[11] Patent Number: 4,635,002
[45] Date of Patent: Jan. 6, 1987

[54] METAL OXIDE SEMICONDUCTOR LOGARITHMIC VOLTAGE CONTROLLED OSCILLATOR

[75] Inventor: G. Fred Riebeek, San Jose, Calif.

[73] Assignee: American Microsystems, Inc., Santa Clara, Calif.

[21] Appl. No.: 638,096

[22] Filed: Aug. 6, 1984

[51] Int. Cl.[4] .............................................. H03B 5/14
[52] U.S. Cl. ................................................. 331/108 R
[58] Field of Search ........................ 328/145; 330/277; 331/108 R, 1 A, 1 R

[56] References Cited

U.S. PATENT DOCUMENTS 4,463,321 7/1984 Horner ................................. 331/1 R

OTHER PUBLICATIONS

Ralph Smith, *Circuits, Devices, and Systems*, 1976, pp. 337–340.

*Primary Examiner*—Gene Wan
*Attorney, Agent, or Firm*—Steven F. Caserza; Alan H. MacPherson; Kenneth E. Leeds

[57] ABSTRACT

Voltage controlled oscillator (50) provides an exponential transfer function. The frequency of the output signal of the voltage controlled oscillator varies exponentially with the input voltages ($V_{IN1}$, $V_{IN2}$) to the oscillator. The exponential transfer characteristic is provided by means of a MOS field effect transistor (19) biased in its subthreshold range.

4 Claims, 4 Drawing Figures

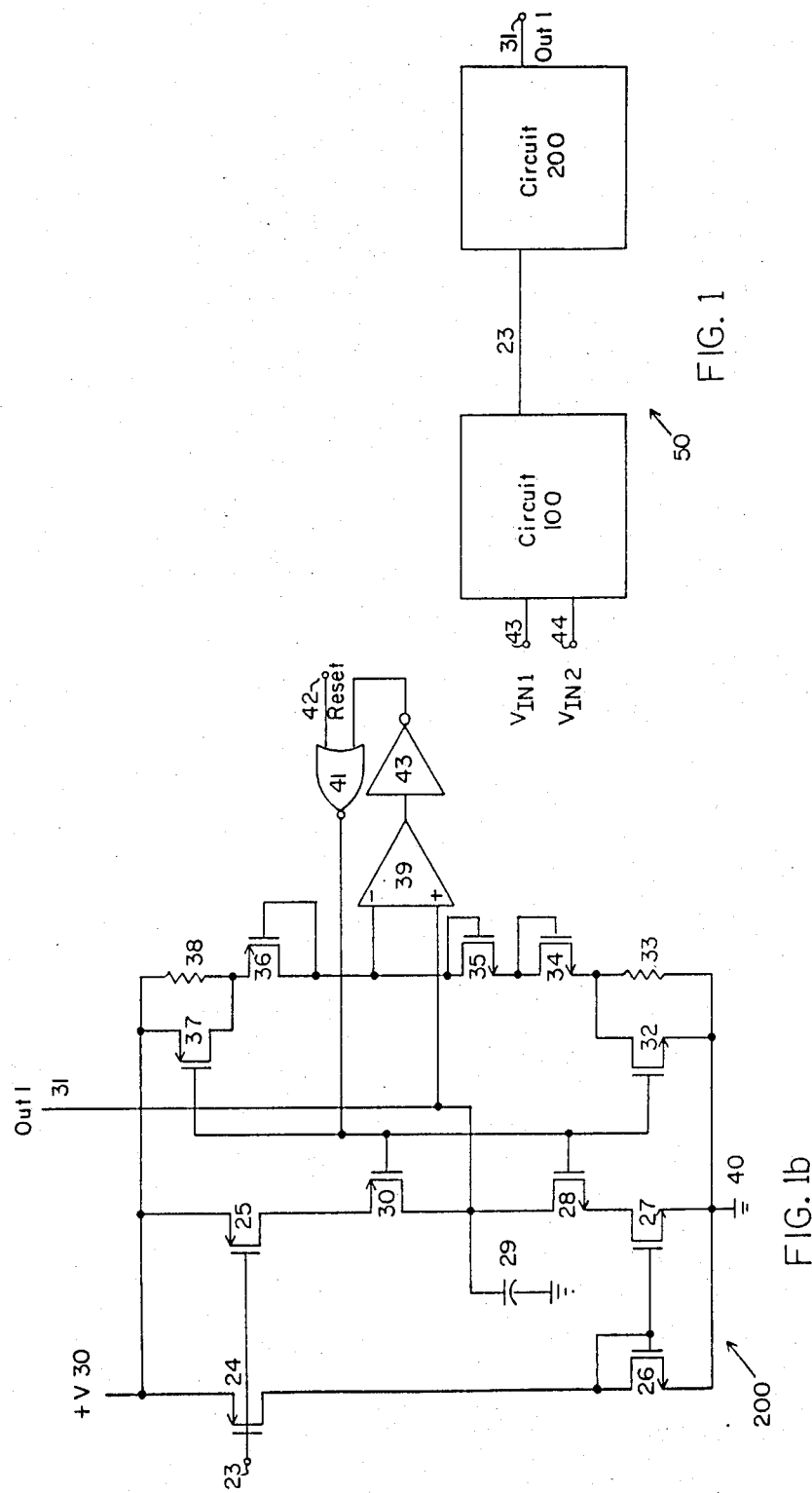

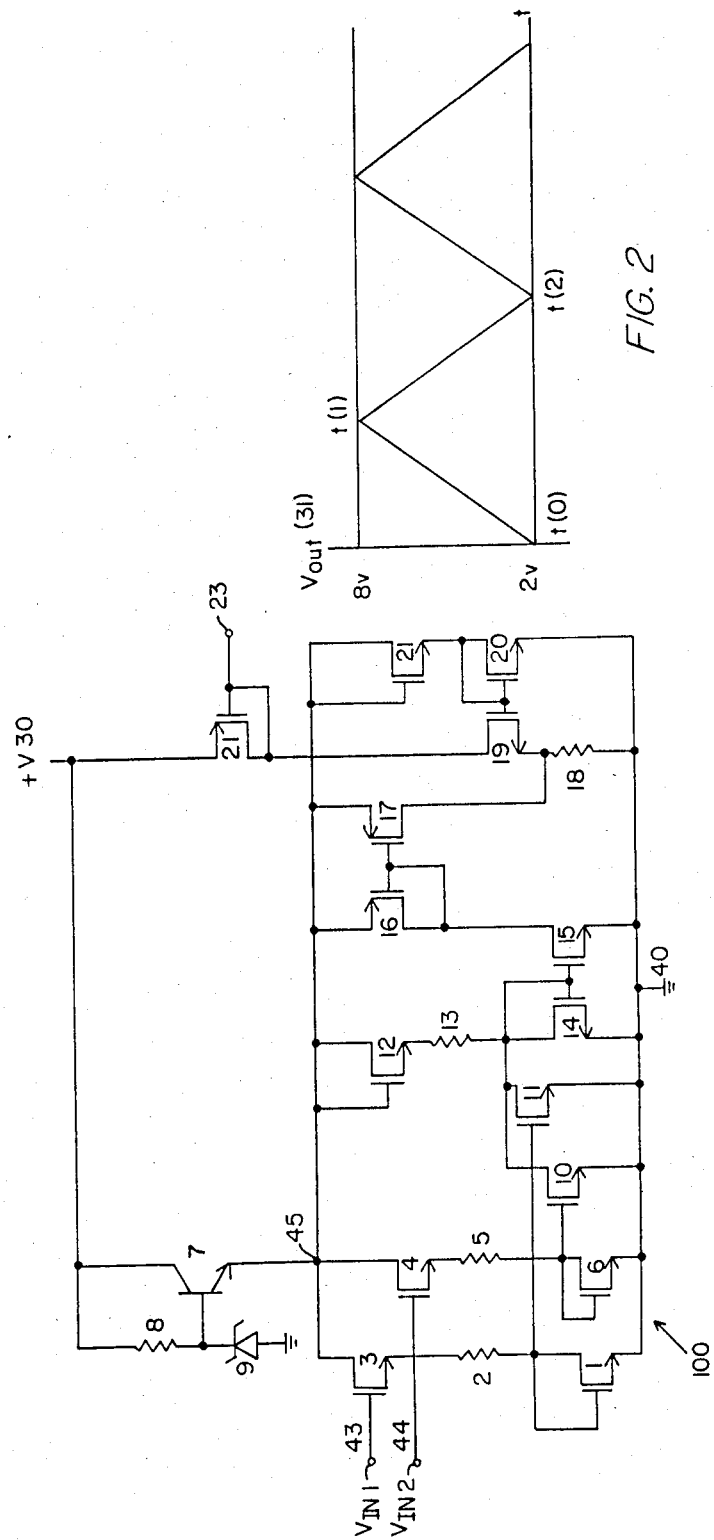

METAL OXIDE SEMICONDUCTOR LOGARITHMIC VOLTAGE CONTROLLED OSCILLATOR

BACKGROUND OF THE INVENTION

This invention relates to voltage controlled oscillators, and more specifically to voltage controlled oscillators which exponentially increase the frequency of the output signal with a linearly increasing input voltage signal.

A voltage controlled oscillator produces an oscillating waveform which varies in frequency in some relationship with an input voltage signal. Voltage controlled oscillators with an exponential transfer characteristic have several applications. Among these applications are use as a test oscillator for recording the acoustic characteristics of a room, a test oscillator for recording the acoustic characteristics of audio components, a test oscillator used in physical hearing examinations, and as an oscillating waveform generator. One of the more important applications of voltage controlled oscillators with an exponential transfer characteristic is in the generation of electronically synthesized music. An example of an oscillator intended for use in the electronic synthesis of music is shown in Rocheleau, "Voltage-Controlled Exponential Oscillator", U.S. Pat. No. 3,605,035, which is hereby incorporated by reference.

A common method of generating the exponential transfer characteristic is to bias a diode in its subthreshold operating range. The use of this technique is described in Robert A. Moog, "Voltage-Controlled Electronic Music Modules", Journal of the Audio Engineering Society, July 1965, which is hereby incorporated by reference. However, when the voltage controlled oscillator is to be incorporated in an integrated circuit including complimentary metal oxide semiconductor devices, it is difficult to construct a diode with the accurate voltage versus current characteristic necessary to utilize the subthreshold biasing technique.

SUMMARY

A voltage controlled oscillator is disclosed which has an exponential transfer characteristic, in that the frequency of the output signal increases exponentially in response to a linearly increasing input voltage signal. The embodiment described herein utilizes metal oxide silicon (MOS) technology. The exponential transfer characteristic is provided by biasing an MOS field effect transistor in its subthreshold operating range.

DESCRIPTION OF THE DRAWINGS

FIG. 1A shows a block diagram of one embodiment of the present invention;

FIG. 1B is a schematic diagram of one embodiment of circuit 100 of FIG. 1A constructed in accordance with this invention;

FIG. 1C is a schematic diagram of one embodiment of circuit 200 of FIG. 1A constructed in accordance with this invention; and FIG. 2 shows a waveform for a ramp wave.

DETAILED DESCRIPTION

FIG. 1A is a block diagram of one embodiment of this invention, showing the relationship between circuit 100 of FIG. 1B and circuit 200 of FIG. 1C. Input signals $V_{IN1}$ and $V_{IN2}$ are the voltage control input signals. Output signal Out1 is a ramp wave whose frequency is exponentially proportional to the voltage levels of $V_{IN1}$ and $V_{IN2}$ shown in FIG. 2. Input signals $V_{IN1}$ and $V_{IN2}$ have an additive effect on the frequency of output signal Out1; thus, the effective control voltage $V_{EFF}$ is equal to $$V_{EFF} = V_{IN1} + V_{IN2}. \tag{1}$$

One embodiment of circuit 100 is shown in FIG. 1B. Input signals $V_{IN1}$ and $V_{IN2}$ are applied to the gates of transistors 3 and 4 via input lead 43 and 44, respectively.

The relationship between $V_{IN1}$ and the current $I_{DS}(1)$ through transistor 1, is calculated as follows. Because the drain of transistor 1 is connected to the gate of transistor 1, $$V_{GS}(1) = V_{DS}(1) \tag{2}$$

where $V_{GS}(1)$ is the gate to source voltage drop of transistor 1, and $V_{DS}(1)$ is the drain to source voltage of transistor 1, and thus $$V_{GS}(1) - V_T(1) < V_{DS}(1) \tag{3}$$

where $V_T(1)$ is the threshold voltage of transistor 1.

(For simplicity throughout this specification, a number in parentheses to the right of a variable, indicates the component to which the variable applies, e.g., $V_T(1)$ is the threshold voltage of N channel MOS field effect transistor 1.)

Therefore, transistor 1 is saturated. The relationship between the gate to source voltage and the drain to source current in a field effect transistor when the transister is saturated is given by the equation, $$I_{DS} = I_{DSS}(V_{GS}/V_T - 1)^2 \tag{4}$$

where $I_{DS}$ is the drain to source current in the field effect transistor, $I_{DSS}$ is a constant determined by the physical size and formation process used to form the transistor (as more fully explained later), $V_{GS}$ is the gate to source voltage, and $V_T$ is the threshold voltage of the field effect transistor.

$I_{DSS}$ is determined by the equation, $$I_{DSS} = (\mu e V_T^2 / 2T)(W/L) \tag{5}$$

where $\mu$ is the average surface mobility of charge carriers in the channel,

T is the thickness of the oxide over the channel, e is the permitivity of the gate dielectric, L is the length of the channel in the direction of current flow, and W is the width of the channel.

Equations 4 and 5 are valid when the MOS field effect transistors are operated in the saturation mode as they are in this circuit, see *MOS Integrated Circuits: Theory, Fabrication, Design, and Systems Applications of MOS LSI*, Penney Ed., p. 69, (1979), which is hereby incorporated by reference.

Solving equations, 4 and 5 for $V_{GS} - V_T$ $$V_{GS} - V_T = (2I_{DS}T/\mu e)^{\frac{1}{2}} \cdot (L/W)^{\frac{1}{2}}. \tag{6}$$

Transistor 1 is fabricated so that W(1) is much greater than L(1) so:

$$V_{GS}(1) - V_T(1) \approx 0 \approx (2I_{DS}(1)T(1)/\mu e)^{\frac{1}{2}} \cdot (L(1)/W(1))^{\frac{1}{2}}. \tag{7}$$

Therefore $$V_{GS}(1) \approx V_T(1) \tag{8}$$

and is relatively fixed with wide variations in $I_{DS}(1)$. Because transistor 1, transistor 3, and resistor 2 are connected in series $$I_{DS}(3) = I_R(2) = I_{DS}(1) \tag{9}$$

where
  $I_R(2)$ is the current through resistor 2.
Summing the voltages from the gate of transistor 3 to ground yields the equation, $$V_{IN1} = V_{GS}(3) + V_R(2) + V_{DS}(1) \tag{10}$$

where
  $V_R(2)$ is the voltage drop across resistor 2.
Substituting for $V_R(2)$ and $V_{GS}(1)$ yields, $$V_{IN1} = V_{GS}(3) + I_R(2)R(2) + V_T, \tag{11}$$

which may be written as $$V_{IN1} - V_{GS}(3) = I_R(2)R(2) + V_T. \tag{12}$$

Summing the voltages from node 45 to ground yields, $$V(45) = V_{DS}(3) + V_R(2) + V_{DS}(1) = V_{DS}(3) + I_R(2)R(2) + V_T \tag{13}$$

where
  V(45) is the voltage at node 45.
Zener diode 9, resistor 8 and transistor 7 form a voltage regulator. Zener diode 9 is biased past its zener breakdown voltage by resistor 8 which also limits the current through zener diode 9 in order to prevent damage to zener diode 9. Because zener diode 9 is biased past its zener breakdown voltage, the voltage drop across zener diode 9 is equal to the zener breakdown voltage typcially 5.8 volts. The voltage at node 45 is then $$V(45) = V_B(9) - V_{BE}(7) \tag{14}$$

where
  $V_B(9)$ is the zener breakdown voltage of zener diode 9 and
  $V_{BE}(7)$ is the base to emitter voltage drop of transistor 7.
$V_{BE}(7)$ is approximately 0.6 volts. $V_B(9)$ is approximately 5.8 volts. Therefore, the voltage at node 45 is a constant 5.2 volts. Transistor 7 is provided to isolate zener diode 9 and resistor 8 from the current drawn through node 45. If node 45 are connected directly to the cathode of zener diode 9 and the current drawn through node 45 were to become large, the voltage drop across resistor 8 may increase above 3.2 volts (if V30 = 9V). The sum of the voltages from positive voltage source V30 to reference potential 40 is $$V(30) = V(8) + V(9) \tag{15}$$

where
  V(30) is the voltage supply level,
  V(8) is the voltage drop across resistor 8, and
  V(9) is the voltage drop across zener diode 9.
If the voltage drop V(8) across resistor 8 becomes greater than 3.2 volts, the voltage drop V(9) across zener diode 9 falls below the zener breakdown voltage and proper voltage regulation would not occur. The base current of transistor 7 is less than 50 microamperes, thus limiting the current through resistor 8 and preventing the voltage drop across zener diode 9 from falling below the zener breakdown voltage.
Substituting for $I_R(2)R(2) + V_T$ in equation 13 yields, $$V(45) - V_{DS}(3) = V_{IN1} - V_{GS}(3) \tag{16}$$

which may be written as $$V(45) - V_{IN1} = V_{DS}(3) - V_{GS}(3), \tag{17}$$

V(45) must be greater than or equal to $V_{IN1}$, thus transistor 3 must be saturated. Thus $$I_{DS}(3) = \frac{\mu e W(3)}{2TL(3)} (V_{GS}(3) - V_R(3))^2. \tag{18}$$

Just as with transistor 1, W(3) is much greater than L(3) so that $$V_{GS}(3) \approx V_T(3)$$

Substituting into equation 11 yields $$V_{IN1} = V_T(3) + I_R(2)R(2) + V_T(1) \tag{19}$$

The threshold voltage $V_T$ of a metal oxide semiconductor transistor is determined by several factors (i.e. gate oxide thickness, channel doping level, etc.) of the transistor, see Millman & Hilkis, *Integrated Electronics: Analog and Digital Circuits and Systems*, page 323 (1972), which is hereby incorporated by reference. All N channel MOS devices in this embodiment are fabricated so that these factors, and thus the threshold voltages are equal in all N channel MOS transistors. Similarly, all P channel MOS devices in this embodiment are constructed so that these factors, and thus the threshold voltages are equal in all P channel MOS transistors.
Thus $V_T(3) = V_T(1) = V_T$.
Equation 19 solved for $I_R(2)$ gives, $$I_R(2) = \frac{V_{IN1} - 2V_T}{R_2} = I_{DS}(3) = I_{DS}(1) \tag{20}$$

Therefore $I_{DS}(3)$ varies linearly in response to $V_{IN1}$. A similar analysis shows that $I_{DS}(4)$ is linearly related to $V_{IN2}$.
Because the gate of transistor 1 is connected to the gate of transistor 11 and the source of transistor 1 is connected to the source of transistor 11, $V_{GS}$ in transistor 1 is equal to $V_{GS}$ in transistor 11. Solving equation 4 for $V_{GS}$ gives, $$V_{GS} = V_T \left(1 + \frac{I_{DS}}{I_{DSS}}\right)^{\frac{1}{2}}. \tag{21}$$

By equating the two gate to source voltages, the drain current equation becomes $$V_T(1)\left(1 + \frac{I_{DS}(1)}{I_{DSS}(1)}\right)^{\frac{1}{2}} = V_T(11)\left(1 + \frac{I_{DS}(11)}{I_{DSS}(11)}\right)^{\frac{1}{2}} \quad (22)$$

Because all threshold voltages in this embodiment are equal, $V_T(1) = V_T(11)$. Thus, the drain to source current equation becomes $$I_{DS}(11) = \frac{I_{DSS}(11)}{I_{DSS}(1)} I_{DS}(1) \quad (23)$$

Because all N channel MOS field effect transistors are constructed using the same fabrication process, $\mu$, T, e, and $V_T$ are equal in all N-channel MOS field effect transistors in the circuit. Therefore, the drain to source current equation becomes $$I_{DS}(11) = \frac{(W(11)/L(11))}{(W(1)/L(1))} I_{DS}(1). \quad (24)$$

Thus, the current in transistor 11 is proportional to the current in transistor 1, with the proportionality constant depending upon the relative widths and lengths of transistors 1 and 11. This arrangement where the gates are connected together and the sources are connected together in an MOS field effect transistor circuit is known as a "current mirror". Transistors 6 and 10 form another current mirror. Therefore, the current in transistor 10 is proportional to the current in transistor 6.

Transistor 12 and resistor 13 form a constant current source. The result of the previous derivation of equation 20 was $$I_R(2) = I_{DS}(3) = I_{DS}(1) = \frac{V_{IN1} - 2V_T}{R(2)}$$

This equation applies equally well to transistor 12 and resistor 13. In this case $$I_{DS}(12) = I_R(13) = \frac{V_G(12) - 2V_T}{R(13)}, \text{ where} \quad (25)$$

$V_G(12)$ is the voltage level at the gate of transistor 12, and as long as $V_G(12)$ and R(13) remain constant, $I_{DS}(12)$ will remain constant. R(13) is constant and $V_G(12)$ is stabilized by the circuit formed by R8, D9, Q7. Therefore, $I_{DS}(12)$ is a relatively constant current. The current provided by the constant current source formed by transistor 12 and resistor 13 flows through transistor 14, transistor 11 and transistor 10. When transistor 10 and transistor 11 have no drain to source current (i.e., when $V_{IN1}$ and $V_{IN2}$ are less than $V_T(3)$ and $V_T(4)$, respectively), the entire current provided by the constant current source formed by transistor 12 and resistor 13 flows through transistor 14. The drain to source current of transistor 14 is reduced by the drain to source current through transistors 10 and 11. Therefore, the drain to source current through transistor 14 is shown by the equation $$I_{DS}(14) = I_C - I_{DS}(11) - I_{DS}(10) \quad (26)$$

where $I_C$ is equal to the constant current provided by the constant current source formed by transistor 12 and resistor 13.

The current through transistor 14 is mirrored from transistor 14 to transistor 15, which form a current mirror. The current through transistor 15 is mirrored by the current mirror formed by transistor 16 and transistor 17. Therefore, the drain to source current of transistor 17 is shown by the equation, $$I_{DS}(17) = K(I_C - I_{DS}(10) - I_{DS}(11)), \quad (27)$$

where $$K = \frac{W(15)/L(15)}{W(14)/L(14)} \cdot \frac{W(17)/L(17)}{W(16)/L(16)}. \quad (28)$$

Transistors 20 and 21 provide a constant voltage of approximately 0.8 volts, or one threshold voltage drop $V_T$, to the gate of transistor 19.

Because $V_{DS}(20) = V_{GS}(20)$, $$V_{GS}(20) - V_T < V_{DS}(20). \quad (29)$$

Thus transistor 20 is saturated. Therefore $$I_{DS}(20) = \frac{\mu e W(20)}{2T L(20)} (V_{GS} - V_T)^2 \quad (30)$$

which implies $$V_{GS}(20) - V_T = (2I_{DS}(20)T/\mu e)^{\frac{1}{2}}(L(20)/W(20))^{\frac{1}{2}}. \quad (31)$$

W(20) is much greater than L(20) by design, so that $$V_{GS}(20) - V_T \approx 0 \approx (2I_{DS}(20)T/\mu e)^{\frac{1}{2}} \cdot (L(20)/W(20))^{\frac{1}{2}}. \quad (32)$$

Thus, $$V_{GS}(20) \approx V_T \approx 0.8V \quad (33)$$

in most CMOS processes.

This voltage is provided to bias transistor 19 in its subthreshold operating range. The voltage drop across resistor 18 varies with the current through transistor 17, thereby varying the gate to source voltage drop of transistor 19. As the drain to source current of transistor 17 increases in response to a decrease in $V_{IN1} + V_{IN2}$, the voltage drop across resistor 18 increases. As the voltage drop across resistor 18 increases, the gate to source voltage of transistor 19 decreases, thereby decreasing the transconductance of transistor 19 and therefore lowering the amount of drain to source current through transistor 19. Conversely, as the current through transistor 17 decreases in response to an increase in $V_{IN1} + V_{IN2}$, the voltage drop across resistor 18 decreases, thereby increasing the gate to source voltage drop across transistor 19. Therefore, the transconductance of transistor 19 increases and the drain to source current of transistor 19 increases.

The current through R18 is:

$$I_R(18) = I_{DS}(17) + I_{DS}(19) \quad (34)$$

This embodiment is designed so that $I_{DS}(17) \gg I_{DS}(19)$, thus $$I_R(18) \approx I_{DS}(17). \quad (35)$$

Therefore, because $V_S(19)=I_R(18)R(18)$, where $V_S(19)$ is the voltage of the source of transistor 19, thus $$V_S(19) = (I_{DS}(17) + I_{DS}(19))R_{18} \quad (36)$$

and $$V_S(19) \approx I_{DS}(17)R(18) \quad (37)$$

$$V_S(19) = K(I_c - I_{DS}(10) - I_{DS}(11))R_{18} \quad (38)$$

$$= K\left(\frac{V(45) - 2V_T}{R(13)} - \frac{V_{IN1} - 2V_T}{R(2)} - \frac{V_{IN2} - 2V_T}{R(5)}\right)R_{18},$$

which may be written as, $$V_S(19) = K \cdot R(18)\left(\frac{V(45)}{R(13)} - \frac{V_{IN1}}{R(2)} - \frac{V_{IN2}}{R(5)} + \frac{2KR(18)V_T}{R(13)R(2)R(5)}(R(5)R(13) + R(2)R(5) - R(2)R(5))\right) \quad (39)$$

R(2), R(5), R(13) are chosen such that $$R(13) = \frac{R(2)R(5)}{R(2) + R(5)}$$

so that $R(2)R(13)+R(5)R(13)-R(2)R(5)=0$, and therefore $$V_S(19) = KR(18)\left(\frac{V(45)}{R(13)} - \frac{V_{IN1}}{R(2)} - \frac{V_{IN2}}{R(5)}\right) \quad (40)$$

This eliminates $V_T$ from equation 40 and eliminates variations of $V_S(19)$ in response to variations in $V_T$.
Because $$V_G(19)=V_T \text{ and } V_S(19)>V_T, \text{ by design,} \quad (41)$$

then $V_S(19)-V_T>0$ and transistor 19 is biased on its subthreshold range. In this range.

$$I_{DS}(19)=I_{Do}(W(19)/L(19)) \exp(V_G(19)q/nkT) \cdot (\exp(-V_S(19)q/kT) - \exp(-V_D(19)q/kT)) \quad (42)$$

where, $I_{Do}$ and n are constants determined by the fabrication process used to fabricate transistor 19, and kT/q=26 millivolts at 300° T, as shown in "CMOS Analog Integrated Circuits Based on Weak Inversion Operation", E. Vittoz and J. Fellrath, Journal of Solid State Circuits (1977), which is hereby incorporated by reference. Since $V_{G(19)} \approx V_T$ and is fixed, $\exp(V_G(19) Q/nKT)$ is a constant. $V_D(19)$ is large so that $\exp(-V_D(19)q/uT) \approx 0$. The resulting equation for the current in transistor 19 is $$I_{DS}(19)=I'_{Do}(W(19)/L(19))_{exp}(-V_S(19)q/kT) \quad (43)$$

where $I'_{Do}$ is equal to $I_{Do} \cdot \exp(V_G(19) q/nkT)$.

Combing equations 40 and 43 yields, $$I_{DS}(19)=I'_{Do}(W(19)/L9(19))_{exp}(Kq/kT(-V9(45)/R(13)+ V_{IN1}/R(2)- + V_{IN2}/R(5))). \quad (44)$$

Thus the current $I_{DS}(19)$ in transistor 19 is exponentially dependent upon $V_{IN1}$ and $V_{IN2}$.

The current through transistor 19 is mirrored by transistor 21 to transistor 24 and transistor 25 (FIG. 1C). The current through transistor 24 is mirrored by transistor 26 to transistor 27. The widths and lengths of transistors 24, 25, 26, and 27 are chosen so that the current mirrored to transistor 25 is equal to the current mirrored to transistor 27.

FIG. 2 is a graph depicting output signal Out1 produced by the circuit in FIGS. 1B and 1C as a function of time. This waveform appears on output lead 31 of FIG. 1C. Output lead 31 is connected to one plate of capacitor 29. The other plate of capacitor 29 is connected to ground. For example, at time t(0) of FIG. 2, the voltage drop across capacitor 29 of FIG. 1C is approximately 2.0 volts which is the minimum voltage of Out1. The value of the minimum voltage of Out1 is determined by the voltage drop across transistors 34 and 35, as is more fully explained below. This voltage is applied to the noninverting input lead of comparator 39. The inverting input lead of comparator 39 receives a voltage level one gate to source voltage drop (approximately 1 volt) below positive voltage supply V30 (approximately 9 volts). Therefore, the signal on the output lead of comparator 39 is a logical 0 (approximately 0 volts). Because the output signal of comparator 39 is a logical 0, the output signal of inverter 43 is a logical 1 (approximately 9 volts). A logical 0 is provided on reset input terminal 42 during normal operation. Because the input signals to NOR gate 41 are a logical 1 and logical 0, the output signal of NOR gate 41 is a logical 0. This logical 0 turns on transistors 30 and 37 and turns off transistors 28 and 32. Current flows through transistor 30 to capacitor 29, and thus the voltage on capacitor 39 rises. Transistor 37 creates a short across resistor 38, thus the voltage on the noninverting input lead of comparator 39 is one gate to source voltage drop below positive voltage source V30, approximately 9−1V=8V volts. The balance of the voltage difference between positive voltage source V30 and ground is dropped cross transistors 35, 34 and resistor 33.

The voltage across capacitor 29 continues to rise until the voltage on the noninverting input lead of comparator 39 is greater than one gate to source voltage drop below positive voltage source V30. At that time, t(1) in FIG. 2, the output signal of comparator 39 becomes a logical 1, and the output signal of inverter 43 becomes a logical 0. Because the input signals to NOR gate 41 are both logical 0, the output signal of NOR gate 41 is a logical 1. This logical 1 turns off transistors 30 and 37 and turns on transistors 28 and 32. Therefore, current flows through transistor 28 which discharges capacitor 29. Because transistor 32 is on, the inverting input lead of comparator 39 receives a voltage level two gate to source voltage drops above ground. The balance of the voltage difference between positive voltage source V30 and ground is dropped across transistor 36 and resistor 38. Capacitor 29 continues to discharge until the voltage on the noninverting input lead of comparator 39 decreases to a level less than two gate to source voltage drops above ground, approximately 2 volts. At that time, t(2) in FIG. 2, the output signal of comparator 39 switches to a logical 0 and capacitor 29 begins to charge again as previously explained.

The rate at which capacitor 29 charges and discharges is dependent, respectively, upon the current sourced by transistor 25 and the current drawn by transistor 27. The greater the current through transistors 25 and 27, the faster capacitor 29 charges and discharges. Therefore, the frequency of the output waveform at output node 31 is dependent upon the current supplied by transistors 25 and 27. If the current supplied by transistors 25 and 27 doubles, capacitor 29 charges and discharges twice as fast. The voltage drop across a capacitor is given by the equation $$V = Q/C \quad (45)$$

where
V is the voltage drop across the capacitor,
C is the capacitance value of the capacitor, and
Q is the charge on the capacitor.
Differentiating both sides of the equation, with respect to time, gives $$dV/dt = (dQ/dt)/C. \quad (46)$$

The time differential of charge Q, dQ/dt, is the current flowing into the capacitor. Therefore, the equation becomes, $$dV/dt = A/C \quad (47)$$

where
A is the current flowing into the capacitor. Therefore, the frequency of the output at output node 31 is directly proportional to the current which is sourced or drawn by transistors 25 and 27, respectively.

The current through transistors 25 and 27 is directly proportional to the current through transistors 21 (FIG. 1B). The current through transistor 21 is equal to the current through transistor 19, which is inversely and exponentially dependent upon the current through transistor 17, which is inversely proportional to the sum of input voltages $V_{IN1}$ and $V_{IN2}$. The frequency of the output signal on lead 31 is proportional to the current through transistors 25 and 27. Therefore, the frequency of the output signal on output lead 31 is exponentially proportional to the sum of input voltages $V_{IN1}$ and $V_{IN2}$.

Reset input terminal 42 is provided in order to cause the voltage on capacitor 29 to be forced to its maximum value by an external reset signal, and effectively disable oscillation. When reset terminal 42 is brought to a logical 1, the output signal of NOR gate 41 is a logical 0, regardless of the output signal of inverter 43. Therefore, transistors 28 and 32 are off and transistors 30 and 37 are on. Thus, capacitor 29 charges to the voltage level of positive voltage source 30 and remains there until reset terminal 42 receives a logical 0 reset signal, at which time the circuit of this invention begins oscillating in response to input signals $V_{IN1}$ and $V_{IN2}$.

While this specification illustrates specific embodiments of this invention it is not to be interpreted as limiting the scope of the invention. Many embodiments of this invention will become evident to those of ordinary skill in the art in light of the teachings of this specification.

I claim:

1. A voltage controlled oscillator which receives an input voltage and which provides an output signal having a frequency which increases exponentially in response to a linearly increasing input voltage, said exponential increase being provided by an MOS field effect transistor biased to operate in its subthreshold range.

2. A voltage controlled oscillator as in claim 1, wherein said output signal is a linear ramp wave.

3. A voltage controlled oscillator having a control voltage input terminal and an output terminal, comprising:
   exponential transfer function means having a control signal input lead connected to said control voltage input terminal for receiving a control voltage, wherein said exponential transfer function means provides an exponential output signal which varies in an exponential relationship with said control signal, said exponential relationship being provided by an MOS field effect transistor biased to operate in its subthreshold range; and
   oscillation means having an oscillator output lead for providing an oscillating output signal in response to said exponential output signal.

4. A voltage controlled oscillator having a control voltage input terminal and an output terminal, comprising:
   means for alternately sourcing or sinking current, having a control voltage input lead connected to said control voltage input terminal for receiving a control signal which causes said means for alternately sourcing or sinking current to vary the magnitude of current sourced or sunk by said means to vary in an exponential relationship with the voltage of said control signal, said means also having a current output lead, and having a current control lead for receiving a current control signal which selectively causes said means to either source or sink current;
   a capacitor having a first lead connected to said current output lead, and having a second lead connected to a reference potential; and
   voltage measurement means having a voltage input terminal for receiving a voltage signal connected to said first lead of said capacitor, and having a control output lead connected to said current control lead wherein, when said current control signal is a first signal and said voltage signal is above first selected voltage level, said current control output level provides a second signal causing said means for alternately sourcing or sinking current to draw current into said current output lead, and when said current control signal is a second signal and said voltage signal is below a second selected voltage, said current control output lead provides said first control signal causing said means for alternately sourcing or sinking current to provide current on said current output lead for providing said current control signal.

* * * * *